United States Patent [19]

Seifert et al.

[11] Patent Number: 4,461,671
[45] Date of Patent: Jul. 24, 1984

[54] PROCESS FOR THE MANUFACTURE OF SEMICONDUCTOR WAFERS

[75] Inventors: Dieter Seifert, Neuötting; Erhard Sirtl, Marktl; Cord Gessert, Burghausen, all of Fed. Rep. of Germany

[73] Assignee: Heliotronic Forschungs- und Entwicklungs Gesellschaft fur Solarzellen-Grundstoffe mbH, Burghausen, Fed. Rep. of Germany

[21] Appl. No.: 344,370

[22] Filed: Feb. 1, 1982

[30] Foreign Application Priority Data

Feb. 27, 1981 [DE] Fed. Rep. of Germany ....... 3107596

[51] Int. Cl.³ .............................................. C30B 19/00
[52] U.S. Cl. ............................ 156/607; 156/DIG. 88
[58] Field of Search ....... 156/607, 622, 624, DIG. 88, 156/DIG. 64, 619; 427/86; 148/172; 422/248

[56] References Cited

U.S. PATENT DOCUMENTS 4,305,776 12/1981 Gradmaier .......................... 156/607
4,319,953 3/1982 Gradmaier .......................... 156/622

FOREIGN PATENT DOCUMENTS 2914506 10/1980 Fed. Rep. of Germany ...... 156/624

OTHER PUBLICATIONS

Electronics, v 51, No. 15, 7/78, pp. 44, 46.

Primary Examiner—Hiram H. Bernstein
Attorney, Agent, or Firm—Collard, Roe & Galgano

[57] ABSTRACT

The invention relates to a process for the direct manufacture of semiconductor wafers, wherein the semiconductor wafers are obtained from molten semiconductor material by providing an area of the surface of the semiconductor melt that corresponds approximately to the size of the wafer with at least one seed crystal, by allowing this area of the surface to cool until it solidifies, the cooling being brought about at least substantially by loss of heat by radiation, and finally, by removing the crystallized-out wafer from the surface. If elemental silicon is used as the semiconductor material, wafers that are suitable for further processing to form solar cells are obtained.

8 Claims, 5 Drawing Figures

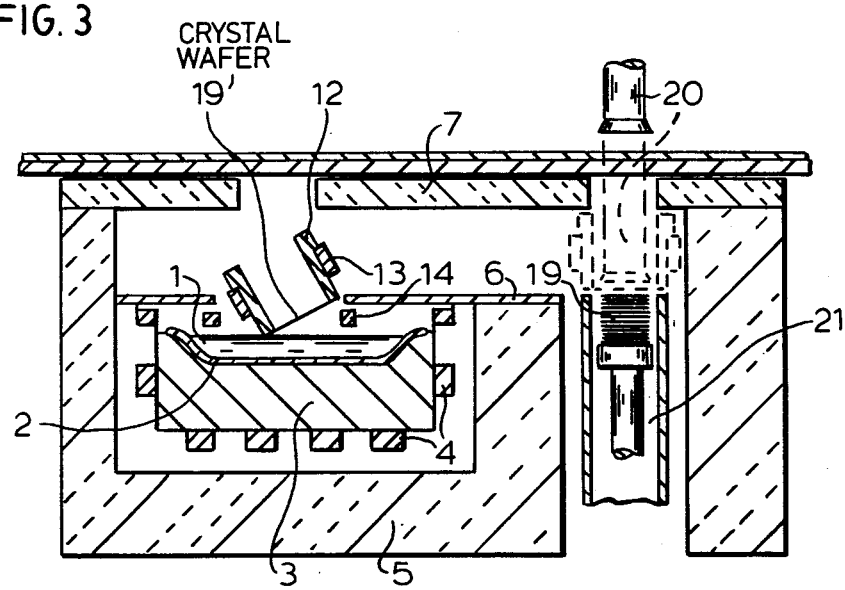
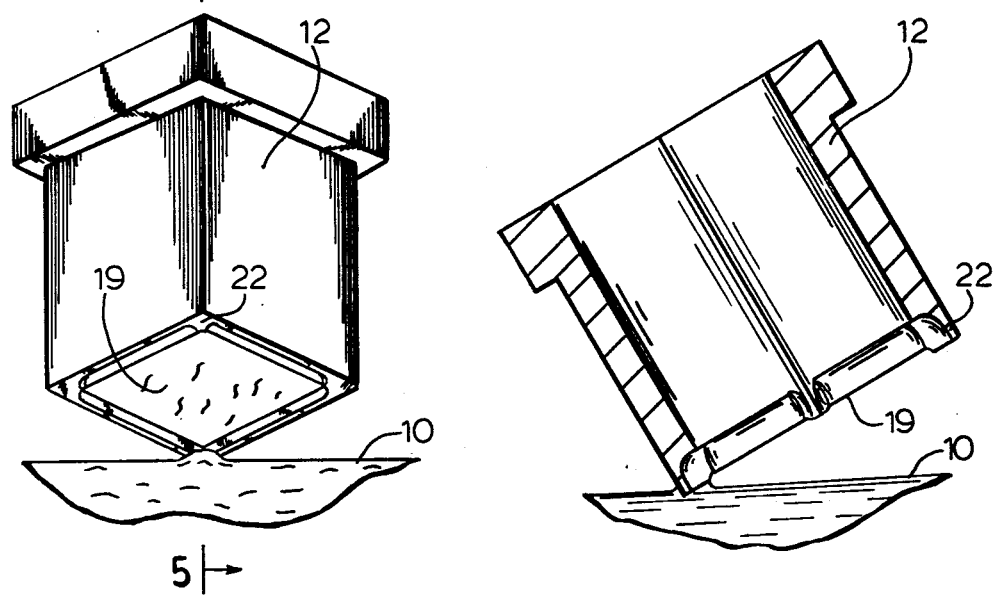

PROCESS FOR THE MANUFACTURE OF SEMICONDUCTOR WAFERS

The invention relates to a process for the manufacture of semiconductor wafers in which the semiconductor wafers are obtained from molten semiconductor material.

Semiconductor wafers are generally obtained by sawing rods or blocks of semiconductor material into wafers. Such separation methods, however, involve high losses of starting material, great wear on machine tools, and considerable expense with regard to time and money.

Processes have therefore also been proposed for pulling semiconductor material out of a melt in the form of strips, thus avoiding, to a large extent, the problems described above. A disadvantage of these processes, however, is the relatively low yield of material because of the low pulling speeds which are a condition of these processes. On the other hand, in the processes, likewise already proposed, for crystallizing out strips more rapidly, the crystal structure is not satisfactory.

In addition, Germal Offenlegungsschrift No. 29 14 506 describes a process for the direct manufacture of plate-shaped silicon crystals having a columnar structure, according to which a cooling gas is blown through a nozzle system onto the melt surface, thus solidifying the melt surface. In this process, however, there is a danger of undesired (e.g., dendritic) growth of the crystal. Furthermore, movements in the melt, caused by the gas flow have an unfavorable effect on the geometrical arrangement and on the crystal structure of the plates.

It is therefore an object of the invention to develop a process which makes possible the manufacture of semiconductor material in the shape of a wafer, in which, the roundabout way of manufacturing them from relatively initially large units, such as strips, rods, blocks and the like, can be dispensed with, and in which a suitable crystal structure of the wafers can be achieved at high production speeds.

According to the invention, this object is attained by a process for the manufacture of semiconductor wafers in which the semiconductor wafers are obtained from molten semiconductor material, which process is characterized by the following process steps:

(a) an area of the melt surface corresponding approximately to the size of the wafer is provided with at least one seed crystal, (b) the area of the melt surface corresponding approximately to the size of the wafer is allowed to cool until it solidifies, the cooling being brought about at least substantially by loss of heat by radiation, and (c) the wafer is removed from the melt surface.

Preferably, the area of the melt surface to be crystallized is provided with from 1 to 500, and preferably from 10 to 100, seed crystals per cm$^2$.

Preferably, elemental silicon is used as the semiconductor material. Other examples of semiconductor materials are, inter alia, germanium and gallium arsenide.

As is known, molten semiconductor materials have to be protected from the influence of the surrounding atmosphere. Accordingly, the process according to the invention is carried out in a closed system under a protective gas or, if desired, in vacuo. As protective gases, there come into consideration the noble gases, preferably argon.

In an arrangement of this type, a melt of semiconductor material is prepared. There may be used, as crucible material, any material that has been used hitherto for the preparation of semiconductor melts, especially quartz or graphite.

It is advantageous to eliminate, to a large extent, convection currents within the melt. Advantageously, therefore, the crucibles used are those that, at least in the area in which the semiconductor wafer is crystallized out, are relatively flat. Typically the crucibles are therefore in the form of a flat tub or trough.

Advantageously, the crucible is heated electrically. A resistance heater is advantageous because this results in only slight movements in the melt.

In the first instance, the melt surface is protected from loss of heat, especially loss of heat by radiation, to the relatively cold surroundings by means of a thermally insulating shield. This thermally insulating ield consists, in its simple form, of a cover arranged over the crucible and provided with openings (windows) that can be closed. Suitable materials for the thermally insulating shield are, for example, graphite plates, graphite felts, molybdenum sheets, and the like.

The average temperature of the main body of the melt is close to the solidification point of the semiconductor material. Deviations of up to +50° C., based on the melting point of the system, which is in thermodynamic equilibrium, have proved suitable. Preferably, however, the temperature deviates by up to +5° C.

To manufacture a semiconductor wafer, an area of the melt surface that corresponds approximately to the size and shape of the wafer to be crystallized out is provided with at least one seed crystal.

As seed crystals, there are used small thin crystalline wafers consisting of the same semiconductor material as do the semiconductor wafers to be obtained, wherein, in an especially advantageous embodiment of the process, the seed crystal wafers have a structure in which their basal and upper faces have an orientation such that they are slow growing faces, whereas the edge faces are rapidly growing faces (rapidly displacing faces).

Accordingly, in the case of elemental silicon, the basal and upper faces are the 1,1,1-planes.

Seed crystals of this type can be obtained by recrystallization of the semiconductor material in metal melts. For example, seed crystals of elemental silicon having the above-described especially favorable structure can be prepared by recrystallization of elemental silicon in aluminum melts.

Usually, the seed crystal material is after-treated by means of etching. It may, optionally, also be subjected to comminution and subsequent grading or size sorting.

The size (measured as the edge length) of the seed crystal is between 0.02 and 5 mm. It is decisive in determining the speed of growth of the semiconductor wafers to be obtained. For the manufacture of wafers having few seed centers, it is preferred to use seed crystals of a size within the upper above-mentioned range; typically crystals having an edge length of approximately 2 mm for a monocrystalline plate. On the other hand, for plates having many seed centers, for example, 25 seed centers per cm$^2$ (to obtain a columnar structure), typically seed crystals having an edge length of about 0.5 mm are used. The thickness of the seed crystals is usually from 0.02 to 0.2 mm.

Before their use according to the invention, the seed crystals are preferably baked out (i.e., subjected to heat treatment) in vacuo. As a further measure, it is often recommended that the seed crystals be electrically charged in order to avoid adhesion of the seed crystals to one another.

A reproducible method of application of the seed crystals, with regard to both their number and their geometrical arrangement (i.e., their distance from one another on the melt surface), is to separate the seed crystals so that the desired quantity of seed crystals is removed from a supply, whirled up in a vessel, and completely or partially collected in a sieve having a base that can be closed. Finally, by removing the sieve closure, the seed crystals are allowed to fall individually onto the surface in the geometrical arrangement determined by the sieve.

Furthermore, for the manufacture of a semiconductor wafer, heat is removed from an area of the melt surface that corresponds approximately to the size and shape of the wafer to be crystallized. This can be carried out, for example, by opening a window provided in the thermally-insulating shield. The window can be formed also, however, by pushing away an insulating lid of an opening in the thermally-insulating shield. In this manner, an area of the melt surface, the size and shape of which depend on the size and shape of the window, suffers a loss of heat brought about, for the most part, by heat radiation.

The temporal sequence of seeding the area of the melt surface to be crystallized out and allowing it to cool can be varied within the following limits: the cooling to the crystallization temperature must take place before the applied seed crystals melt. On the other hand, prior to seeding, the cooling of the area of the melt surface to be crystallized out must not advance so far that spontaneous and, in this case, often undesired dendritic crystal growth occurs. Therefore, the presence of at least one seed crystal within the area of the surface to be crystallized represents a substantial control element for the crystallization process according to the invention.

Since the supply of the seed crystals is advantageously arranged outside the thermally insulating shield, the following temporal sequence is generally observed for seeding the area of the melt surface to be crystallized out and for allowing it to cool: the cooling process is initiated by opening a window or the like in the thermally insulating shield; through the opening that has been made, at least one seed crystal is then applied to the melt surface; the device containing the supply of seed crystals is then removed from the opening; and, finally, the cooling measures, optionally intensified, are continued.

As described above, the area of the melt surface to be crystallized is cooled, for the most part, by radiation. The heat radiation is absorbed in a simple manner by the optionally cooled walls of the apparatus. A special cooling device, however, such as for example, a heat dissipator, may also be provided. In an advantageous embodiment, the cooling device can be moved in a direction at right-angles to the melt surface so that by varying the distance of the cooling face from the melt surface, the speed of cooling can be controlled. In this case, it is useful to give the part of the cooling device directed towards the melt surface approximately the shape and size of the semiconductor wafer to be crystallized out.

The area of the surface to be crystallized can be defined even more exactly by dipping into the melt a crystallization former (i.e., a frame) which may be connected to the cooling system, and which determines the shape of the wafer to be obtained. Instead of dipping it into the melt, the former may instead be brought downward close to the melt. In another embodiment, the former is arranged within the melt and emerges from the melt during the crystallization process.

The progress of the cooling can be controlled by further measures. For example, it may be controlled by spatial and temporal variation of the size of the window or by the application of sheets or radiation screens.

A further possible method of cooling, after a solid layer has formed on the area of the surface to be crystallized, is to blow inert gas over that area. However, in this case, care must be taken that the gas flows over substantially only the solid layer, since otherwise unfavorable movement could occur in the melt. In order to control the removal of heat in accordance with the growth of the crystal, it is also advantageous to place additional heating devices close to the surface, thus providing a further way of finely regulating the temperature conditions at the surface.

The crystallization process is therefore controlled substantially by the following measures or parameters:

1. The regulation of the heating of the main body of the melt;
2. The application of the seed crystals in a preferably defined number and geometrical arrangement in the area of the melt surface to be crystallized.
3. The choice of the size and thickness of the seed crystals according to the number of seed crystals applied or the number of seed centers desired in the wafer; and
4. The cooling of the area of the melt surface to be crystallized, using the following measures, alone or in combination, on the one hand to control the removal of heat in accordance with the crystallization process, and, on the other hand, to control the crystallization process:

(a) variation of the window size in the thermally insulating shield,
   (b) variation of the distance of a heat dissipator arranged opposite to the melt surface,
   (c) blowing a cooling inert gas over the area of the melt surface that has already crystallized into a cohesive layer, especially in order to promote the growth in thickness, and
   (d) heating of the melt surface with the aid of heating elements close to the surface.

Various techniques can be used to remove the crystallized wafers:

For example, the wafer floating on the melt surface can be gripped by a gripper, stripped off, and drawn off, or it can be pushed out with a ram and over a ramp. According to another method of removal, the crystallized wafer is raised by a lifting device in the melt.

A further possible method of removal consists of allowing the semiconductor wafer to grow, in the course of the crystallization process, onto a carrier that is part of a transport device, and lifting the carrier, together with the wafer, away from the melt surface. The wafer is separated from the carrier, for example, by breaking it out by means of a punch or, advantageously, by means of a chisel oscillating at a high frequency. Further suitable methods of separation include melting away the connection between the wafer and carrier. As separating tools, electron beam sources and laser light sources are also suitable.

It is especially advantageous to allow the part of the melt that is crystallizing out to grow on separate projections or finger-shaped or nose-like extensions of the carrier so that the parts of the semiconductor wafer that grow in contact with the carrier are only in the form of narrow bridges, thus enabling the connection between the carrier and wafer to be readily broken.

In addition, if the process is carried out under sufficient inert-gas pressure, the wafers may be removed by suction plates and the like.

In all of the above-described methods of removing the semiconductor wafers, it is advantageous to initially lift the wafers, at an angle to the melt surface, thus enabling the melt still adhering to the wafer to run off. It is especially advantageous in this case to proceed in such a manner that, while the melt is running off, the contact of the wafer with the melt surface is not completely broken, in order thereby to utilize the cohesion of the melt.

The present invention also provides a device for carrying out the process, characterized in that it includes a crystallization former provided with projections, which former is connected to a transport device.

These projections are provided so that the wafers to be crystallized out grow onto them. The remaining parts of the crystallization former that dip into the melt are maintained at a temperature above the melt temperature so that a growth of semiconductor material thereon is prevented.

Other objects and features of the present invention will become apparent from the following detailed description considered in connection with the accompanying drawings, which disclose one embodiment of the invention. It is to be understood that the drawings are to be used for the purposes of illustration only, and not as a definition of the limits of the invention.

In the drawings, wherein similar reference characters denote similar elements throughout the several views:

FIG. 3 is a view comparable to that of FIGS. 1 and 2, but showing the following phase when the wafer is removed;

FIG. 4 is a perspective view of a crystallization former; and

FIG. 5 is a cross sectional view taken along line 5—5 of FIG. 4.

Turning now in detail to the drawings, FIGS. 1 to 5 illustrate a device for carrying out the process according to the invention. In each of FIGS. 1, 2 and 3, the same crystallization device is shown diagrammatically with the three main phase of the crystallization process being sequentially represented. The device is in a vessel (not shown) under a vacuum and/or a protective-gas system.

Figure 1:
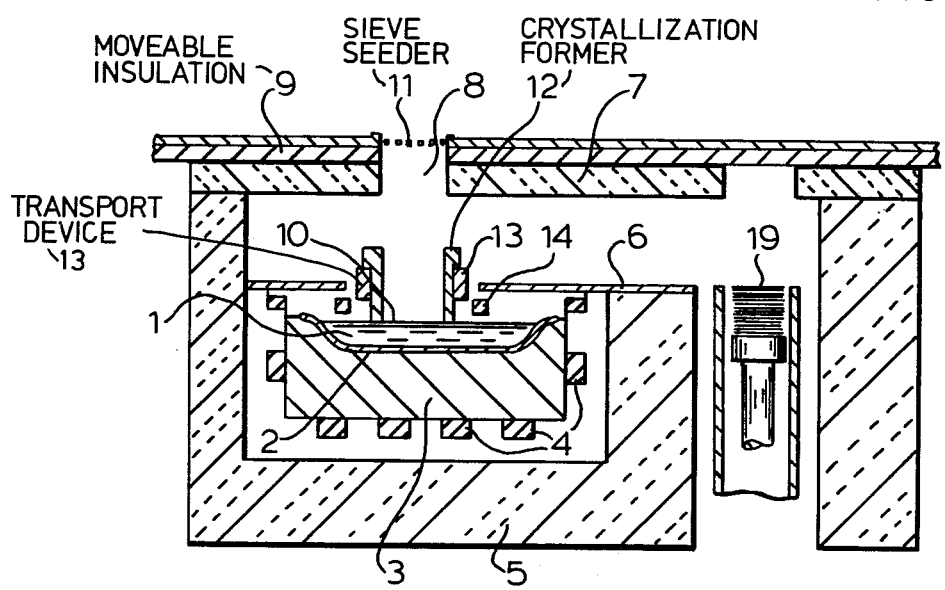
FIG. 1 is a diagrammatic side view of a device embodying the present invention at the start of the crystallization process.

FIG. 1 shows the state of the device at the beginning of the crystallization process:

The melt 1 consisting of a semiconductor material is in a tub-shaped crucible 2 which is accommodated in a crucible holder 3 and is maintained at a temperature somewhat above the melting point by means of the resistance heating elements 4. The crucible 2 and the heating device are disposed in an insulating system 5. A radiation screen 6 and a thermally-insulating shield 7 provided with a window 8, which can be closed by a moveable insulation unit 9, are situated above the crucible arrangement. The window 8 is above the area 10 of the melt surface which is to be crystallized.

Preferably, a moveable seeding device 11 in the form of a sieve, which is provided with seed crystals and which releases the seed crystals after it has been struck or shaken, is used for seeding. During the seeding of the melt surface, this sieve is arranged above the area 10 of the melt surface to be crystallized, as is a crystallization former 12. Furthermore, the crystallization former 12 is connected to a transport device 13, which serves to remove the wafer that has crystallized out. Further heating elements 14 are arranged above the melt, in order to control the temperature conditions at the melt surface and also to control the temperature of the crystallization former.

Figure 2:
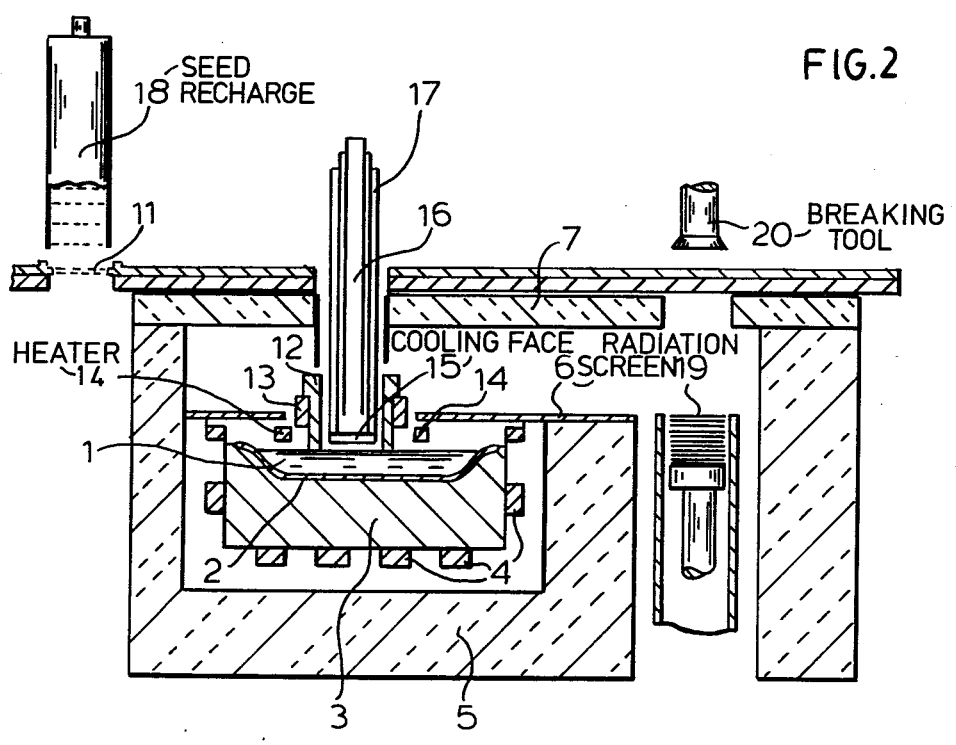
FIG. 2 is a view comparable to that of FIG. 1, but showing the next phase of the crystallization process.

FIG. 2 shows the phase of the crystallization process that follows the phase shown diagrammatically in FIG. 1, insofar as it relates to the device:

The seeding device 11 is removed, so that a heat dissipator can be introduced to bring about a uniform cooling of the area of the surface to be crystallized. The heat dissipator has a cooling face 15 directed toward the area of the surface to be crystallized and is constructed in the form of a double tube 16 provided with insulation 17. At the same time, the seeding device 11 is removed to a seed crystal recharging device 18.

FIG. 3 shows the phase when the crystallized wafer 19 is removed. In the first instance, the crystallization former 12 is raised by the transport device 13 at an angle in order to enable adhering melt to run off. The crystallization former, together with the wafer, is then moved into the position shown by the dotted line in FIG. 3, where the semiconductor wafer is broken out of the former with the aid of a tool 20 and finally placed in a store or storage chute 21.

FIGS. 4 and 5 show a perspective side view and a cross-sectional view, respectively, of the crystallization former 12 shortly before the wafer 19 is removed. The former 12 is raised at an angle to the melt surface in such a manner that there remains only an almost point-shaped connection between the wafer 19 or the former 12 and the melt surface 10. Furthermore, the Figures show that the wafer has grown onto the crystallization former only on the nose-like or finger-shaped projections 22. Thus, the semiconductor wafer grows onto the crystallization former only in narrow bridge portions and can be readily broken out. In addition, only very small menisci are formed between the nose-like projections of the crystallization former and the melt, so that even in the edge portions of the plates there is almost plane parallelism.

It is to be understood that, for industrial purposes, several crystallization devices of this type may be arranged within a single vessel.

According to the process of the invention, it is possible to achieve high rates of production of semiconductor wafers. The crystallization process for a wafer having a thickness of approximately 0.4 mm and a surface of approximately 10 cm × 10 cm (these dimensions correspond to typical uses for wafers of this type) takes a period of from approximately 10 to 100 seconds. The desired wafer shape is obtained directly and costly processing steps and losses of material are eliminated. Likewise, the energy requirement during production is low since the crystallization steps take place with little loss of heat. A further advantage of the process is that the crystallization steps take place together with a step for segregating the impurities present in the starting material, so that slighter demands are made on the purity of the starting materials.

For example, when manufacturing wafers of elemental silicon according to the process of the invention, polycrystalline material having a columnar structure especially favorable for solar cells is obtained at low cost. Especially with reference to the present-day energy problems, the process thus represents an important advance in the field of alternative energy production.

The invention is now explained in detail with reference to the following example which is given by way of illustration only and not of limitation:

(a) Manufacture of a polycrystalline Semiconductor Wafer of Elemental Silicon.

Devices are used such as those represented in FIGS. 1 to 5. The devices are situated in a vessel under a reduced pressure and protective gas system. The operating pressure is $10^{-2}$ bar abs.

A melt of elemental silicon having a known degree of purity corresponding to solar-cell quality and the required content of dopants is maintained at a temperature of approximately 1420° C. The melt is protected from loss of heat by a thermally insulating shield of graphite. A window provided in the cover is then opened in order to initiate the crystallization process. A sieve which is provided with seed crystals and from which, by shaking, 25 seed crystals per cm² are scattered over the area of the melt surface to be crystallized (100×100 mm) is moved over the window. The uniform distance of the seed crystals from one another is provided by the geometric arrangement of the sieve.

The seed crystals are small wafers having a thickness of approximately 0.05 mm and a length and breadth of approximately 1 mm. Before being used, the seed crystals are baked out in vacuo in order to free them from surface impurities.

After the seed crystals have been applied, the sieve is removed to the reloading position. At the same time, a heat dissipator is placed over the area of the melt surface to be crystallized and is brought close to the melt surface to control the cooling process inititated by opening the window in the thermally insulating shield. In the initial phase, crystallization occurs in the direction of the melt surface, starting from the seed crystals, because of the temperature drop in the melt, and a cohesive crystal layer is formed. The crystallization former serves to delimit more exactly the area of the surface to be cooled and crystallized, and the wafer to be obtained grows on the finger-shaped projections of the crystallization former.

The continuing cooling process then also promotes the growth in thickness of the crystals being formed. After 25 seconds, a wafer thickness of approximately 0.4 mm is achieved. The crystallization former is then lifted at an angle in such a manner that finally only one corner of the crystallization former remains in contact with the melt. After the melt adhering to the wafer has run off, the wafer is then removed completely from the melt surface and removed to over the storage device, by means of a swivelling device connected to the crystallization former. At the same time, the heat dissipator is removed and, finally, the window in the thermally insulating shield is closed in order to give the melt an opportunity for regeneration. Crystal pieces floating in the melt can, if desired, be melted by means of the heating device near the surface.

Finally, the wafer obtained is broken out of the former by means of a punch and put into the store. The former is then returned to the starting position (according to FIG. 1).

One sequence for the manufacture of a silicon wafer is thus completed.

A wafer having a thickness of 0.38 mm and a size of approximately 100 mm×100 mm is obtained. The wafer has a columnar structure and can be processed further to form a solar cell according to known techniques.

(b) Manufacture of Seed Crystals of Elemental Silicon.

Elemental silicon and metallic aluminum in a weight ratio of 2:3 are melted at 1000° C. in an induction-heated graphite crucible under a protective-gas atmosphere (argon). After a clear melt has been obtained, it is gradually cooled to a temperature of 650° C. During that cooling process, elemental silicon crystallizes out in the form of small wafers (platelets).

The small wafers obtained are separated from the hot melt at approximately 650° by centrifugation.

After cooling, the crystallite is comminuted and etched with hydrochloric acid in order to remove completely any aluminum still adhering. Finally, the crystals are graded using a sieve and heated or baked out in a vacuum.

The seed crystals obtained according to this method are doped with aluminum. The aluminum content can advantageously be used as reverse-side doping when the wafer obtained is to be further processed into solar cells, whereas the side of the wafer lying upwards during the crystallization process is used as the reverse side of the solar cell.

While only one embodiment and several examples of the present invention have been shown and/or described, it is obvious that many changes and modifications may be made thereunto without departing from the spirt and scope of the invention.

What is claimed is:

1. A process for the manufacture of semiconductor wafers directly from molten semiconductor material, comprising the steps of:
   (a) producing a bath of molten semiconductor material having a melt surface;
   (b) seeding an area of the melt surface corresponding approximately to the size of the desired wafer by allowing at least one seed crystal to fall freely onto said melt surface;
   (c) allowing the area of the melt surface corresponding approximately to the size of the desired wafer to cool until it solidifies and floats freely on the melt surface, the cooling being brought about at least substantially by loss of heat by radiation; and
   (d) removing the freely floating wafer from the melt surface.

2. The process according to claim 1, wherein the number of seed crystals is from 1 to 500, per 1 cm² of the melt surface.

3. The process according to claim 2, wherein said number of seed crystals is from 10 to 100 per cm² of melt surface.

4. The process according to claim 1, 2 or 3, wherein elemental silicon is used as the semiconductor material.

5. The process according to claim 1, wherein said wafer to be crystallized out grows onto a crystallization former.

6. The process according to claim 4, wherein wafer-shaped crystals, the basal and upper faces of which form the 1,1,1-planes, are used as seed crystals.

7. The process according to claim 1, wherein step (b) comprises collecting a multiplicity of seed crystals in a sieve having a removable base, arranging said sieve over the melt surface, and removing the base of said sieve so as to allow the seed crystals to fall individually onto the melt surface in a geometrical arrangement determined by the configuration of the sieve.

8. The process of claim 1 wherein said step (c) is performed by bringing removable cooling means disposed within hollow wafer withdrawal means to a position adjacent to the area of the melt surface to be solidified to effect cooling and solidification thereof in the form of a wafer and thereafter removing said cooling means to a position removed from said melt surface and wherein said step (d) is performed by contacting said melt surface with said hollow wafer withdrawal means so that the wafer formed is secured to said withdrawal means solely at the edges thereof and withdrawing said withdrawl means to a position removed from said melt surface whereat said wafer is detached from said withdrawal means.

* * * * *